(12) United States Patent
Pan et al.

(10) Patent No.: US 9,768,052 B2
(45) Date of Patent: Sep. 19, 2017

(54) MINIMAL CONTACT EDGE RING FOR RAPID THERMAL PROCESSING

(71) Applicant: Applied Materials, Inc., Santa Clara, CA (US)

(72) Inventors: Heng Pan, Santa Clara, CA (US); Kevin J. Bautista, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 666 days.

(21) Appl. No.: 14/203,163

(22) Filed: Mar. 10, 2014

(65) Prior Publication Data

US 2014/0265101 A1 Sep. 18, 2014

Related U.S. Application Data

(60) Provisional application No. 61/782,150, filed on Mar. 14, 2013.

(51) Int. Cl.
| | | |
|---|---|---|
| *H01L 21/683* | (2006.01) | |
| *H01L 21/687* | (2006.01) | |
| *H01L 21/67* | (2006.01) | |
| *C23C 16/458* | (2006.01) | |
| *C30B 25/12* | (2006.01) | |

(52) U.S. Cl.
CPC .. *H01L 21/68735* (2013.01); *H01L 21/67115* (2013.01); *C23C 16/4585* (2013.01); *C30B 25/12* (2013.01); *H01L 21/67248* (2013.01)

(58) Field of Classification Search
CPC ........... H01L 21/6711; H01L 21/68735; H01L 21/67346; H01L 21/683; H01L 21/68742; H01L 21/68785; H01L 21/6875; H01L 21/67115; H01L 21/67248; C23C 16/4585; C23C 14/50; C30B 25/12
USPC ....... 269/14, 289 R, 728, 302; 118/728, 500, 118/729, 715; 392/416, 418; 277/353, 277/394, 397, 402, 436
See application file for complete search history.

(56) References Cited

U.S. PATENT DOCUMENTS

| | | | | |
|---|---|---|---|---|
| 126,624 | A * | 5/1872 | Coffee | F16J 15/106 277/649 |
| 5,885,428 | A | 3/1999 | Kogan | |
| 6,048,403 | A * | 4/2000 | Deaton | C23C 16/4583 118/500 |
| 6,123,338 | A * | 9/2000 | Edelmann | F16C 29/084 277/551 |
| 6,280,183 | B1 * | 8/2001 | Mayur | C23C 16/4585 432/253 |
| 7,700,376 | B2 | 4/2010 | Chacin et al. | |
| 7,718,559 | B2 * | 5/2010 | Yuan | C03B 32/00 156/915 |
| 8,469,368 | B2 | 6/2013 | Kenworthy et al. | |

(Continued)

*Primary Examiner* — Larry E Waggle, Jr.
*Assistant Examiner* — Mahdi H Nejad
(74) *Attorney, Agent, or Firm* — Patterson + Sheridan LLP (57) ABSTRACT

Embodiments of the present invention generally relate to a support ring for supporting a substrate during thermal processing in a process chamber. The support ring generally includes a ring body, an outer rib extending from a first surface of the ring body, a midrib extending from the first surface of the ring body, and a substrate support extending from a second surface of the ring body. The support ring reduces thermal coupling between a substrate and the support ring.

18 Claims, 4 Drawing Sheets

(56) References Cited

U.S. PATENT DOCUMENTS

| | | | |
|---|---|---|---|
| 8,988,848 B2 * | 3/2015 | Todorow | H01L 21/6833 361/234 |
| 2008/0092821 A1 * | 4/2008 | Otsuka | C23C 16/4583 118/728 |
| 2008/0248657 A1 * | 10/2008 | Nenyei | H01L 21/67115 438/799 |
| 2008/0261800 A1 * | 10/2008 | Yuan | C03B 32/00 501/152 |
| 2011/0180983 A1 * | 7/2011 | Arun | H01J 37/32495 269/86 |
| 2012/0213500 A1 * | 8/2012 | Koelmel | F27D 11/12 392/416 |
| 2013/0026693 A1 * | 1/2013 | Ranish | H01L 21/67115 269/305 |
| 2014/0094039 A1 * | 4/2014 | Ranish | H01L 21/67115 438/795 |
| 2015/0020736 A1 * | 1/2015 | Pan | H01L 21/02274 118/723 R |

\* cited by examiner

MINIMAL CONTACT EDGE RING FOR RAPID THERMAL PROCESSING

CROSS-REFERENCE TO RELATED APPLICATIONS

This application claims benefit of U.S. Provisional Patent Application Ser. No. 61/782,150, filed Mar. 14, 2013, which is herein incorporated by reference.

BACKGROUND OF THE INVENTION

Field of the Invention

Embodiments of the present invention generally relate to a support ring to support a substrate in a process chamber.

Description of the Related Art

In the processing of substrates, such as semiconducting substrates, the substrate is placed on a support in a process chamber and suitable processing conditions are maintained in the process chamber. For example, the substrate can be heated in a controlled heating cycle to thermally process the substrate. The substrate can be heated, for example, by an array of heating lamps disposed above and/or below the substrate in the chamber. Thermal processing can be used to anneal a layer that has been ion-implanted on the substrate, perform thermal oxidation or nitridation processes, or perform thermal chemical vapor deposition processes on the substrate.

It has been observed that variations in temperature gradients across the substrate can result in non-uniform processing of the substrate. Non-uniform temperatures occur at different substrate regions because of non-uniform convection or conduction heat losses or gains from regions of the substrate in contact with the support (or other chamber components) versus substrate regions not in contact with the support. Temperature gradients in substrates have been reduced using a substrate support ring that extends inwardly from the chamber wall and surrounds a periphery of the substrate. Particularly, the substrate to be thermally processed is supported on its periphery by an edge of the support ring having an annular lip contacting the edge of the substrate. The support ring effectively expands or pushes out the temperature gradients in the substrate from the substrate periphery to the outer edges of the support ring. The overlapping of the substrate and the support ring also prevents or minimizes the leakage of the high-temperature radiant energy from the radiant heat source (typically disposed above the substrate) around the edge of the support ring on either its inner or outer side.

Support rings having an annular edge can fail to provide adequate temperature uniformity across the substrate in rapid heating rate processes, for example, processes having heating rates of at least about 200° C./second in a rapid thermal processing (RTP) system. In these processes, the difference in heating rates between the support ring and the substrate generates temperature gradients along the periphery of the substrate that become unacceptably high during the heating process step. It is particularly difficult to achieve temperature uniformity across the substrate especially when the substrate is heated at reduced pressure. This is because the contact resistance at the overlapping area between the substrate and the support ring is much larger at lower pressure (since flow through the intimate contact points is dominant), causing the temperature profile at the edge of the substrate to be significantly higher than that at the central area.

Accordingly, it is desirable to have a support ring that facilitates a more uniform temperature gradient of substrates during processing.

SUMMARY OF THE INVENTION

Embodiments of the present invention generally relate to a support ring for supporting a substrate during thermal processing in a process chamber. The support ring generally includes a ring body, an outer rib extending from a first surface of the ring body, a midrib extending from the first surface of the ring body, and a substrate support extending from a second surface of the ring body. The support ring reduces thermal coupling between a substrate and the support ring.

In one embodiment, a support ring comprises a ring body, an outer rib extending perpendicular from a first surface of the ring body, a midrib extending perpendicular from the first surface of the ring body, and a substrate support extending perpendicular from a second surface of the ring body.

In another embodiment, a support ring comprises a ring body, an outer rib extending perpendicularly from a first surface of the ring body, and a midrib extending perpendicularly from the first surface of the ring body. The midrib is positioned concentrically to the outer rib. The support ring also includes a substrate support rib extending perpendicularly from a second surface of the ring body, the substrate support rib including a rounded distal end.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention generally relate to a support ring for supporting a substrate during thermal processing in a process chamber. The support ring generally includes a ring body, an outer rib extending from a first surface of the ring body, a midrib extending from the first surface of the ring body, and a substrate support extending from a second surface of the ring body. The support ring reduces thermal coupling between a substrate and the support ring.

Figure 1:
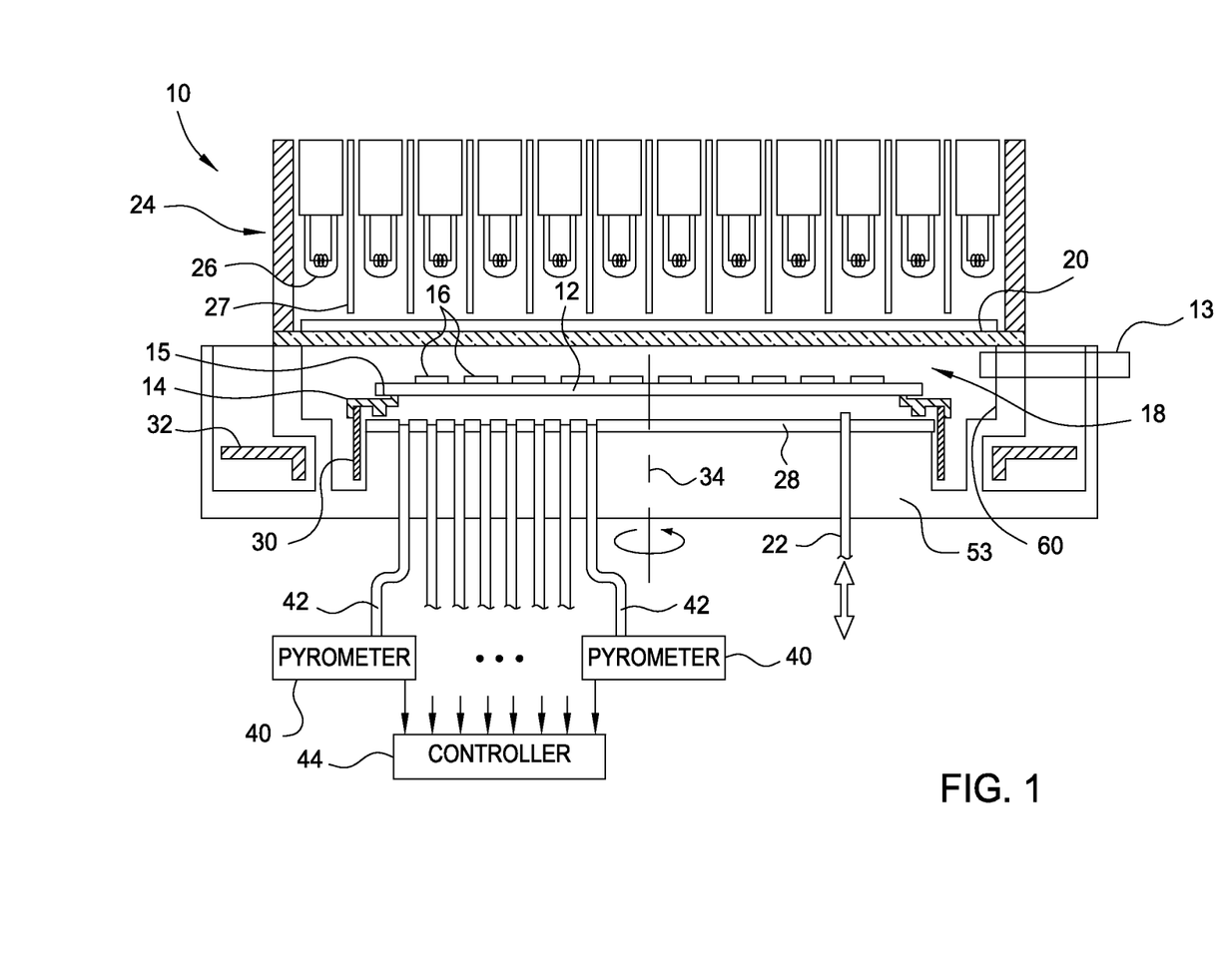
FIG. 1 schematically illustrates an exemplary rapid thermal processing chamber having a substrate support ring, according to one embodiment of the invention.

FIG. 1 schematically represents a rapid thermal processing chamber 10. A substrate 12, for example, a semiconductor substrate such as a silicon substrate to be thermally processed is passed through the valve or access port 13 into the process area 18 of the processing chamber 10. The substrate 12 is supported on a periphery thereof by an annular support ring 14. The substrate 12 may be oriented such that processed features 16 already formed in a front surface of the substrate 12 face upwardly toward a process area 18 defined on its upper side by a transparent quartz window 20. That is, the front surface of the substrate 12 is facing toward the array of lamps 26. In some embodiments, the front surface of the substrate 12 with the processed featured formed thereon may face away from the array of lamps 26, i.e., facing towards the pyrometers 40.

A plurality of lift pins 22, such as three lift pins, may be raised and lowered to support the back side of the substrate 12 when the substrate 12 is handed between a paddle or robot blade (not shown) bringing the substrate into the processing chamber and onto the support ring 14. A radiant heating apparatus 24 is positioned above the window 20 and configured to direct radiant energy toward the substrate 12 through the window 20. In the processing chamber 10, the radiant heating apparatus may include a large number, 409 being an exemplary number, of high-intensity tungsten-halogen lamps 26 positioned in respective reflective tubes 27 arranged in a hexagonal close-packed array above the window 20. The array of lamps 26 may be referred to as a lamphead. However, it is contemplated that other radiant heating apparatus may be substituted. For example, resistive heaters may be utilized. Examples of suitable lamps include mercury vapor lamps having an envelope of glass or silica surrounding a filament and flash lamps which comprise an envelope of glass or silica surrounding a gas such as xenon, which provides a heat source when the gas is energized. As used herein, the term lamp is intended to cover lamps including an envelope that surrounds a heat source. The "heat source" of a lamp refers to a material or element that can increase the temperature of the substrate, for example, a filament or gas that can be energized, or a solid region of a material that emits radiation such as a LED or solid state lasers and laser diodes.

As used herein, rapid thermal processing or RTP refers to an apparatus or a process capable of uniformly heating a substrate at rates of about 50° C./second and higher, for example, at rates of about 100° C./second to 150° C./second, and about 200° C./second to 400° C./second. Typical ramp-down (cooling) rates in RTP chambers are in the range of about 80° C./second to 150° C./second. Some processes performed in RTP chambers require variations in temperature across the substrate of less than a few degrees Celsius. Thus, an RTP chamber must include a lamp or other suitable heating system and heating system control capable of heating at rate of up to about 100° C./second to 150° C./second, and about 200° C./second to 400° C./second, distinguishing rapid thermal processing chambers from other types of thermal chambers that do not have a heating system and heating control system capable of rapidly heating at these rates. An RTP chamber with such a heating control system may anneal a sample in less than 5 seconds, for example, less than 1 second, and in some embodiments, milliseconds.

It is desirable to control the temperature across the substrate 12 to a closely defined temperature. One passive means of improving the uniformity may include a reflector 28 disposed beneath the substrate 12. The reflector 28 extends parallel to and over an area greater than the substrate 12. The reflector 28 efficiently reflects heat radiation emitted from the substrate 12 back toward the substrate 12 to enhance the apparent emissivity of the substrate 12. The spacing between the substrate 12 and the reflector 28 may be between about 3 mm to 9 mm, and the aspect ratio of the width to the thickness of the cavity is advantageously greater than 20. The top of reflector 28, which may be made of aluminum and has a highly reflective surface coating or multi-layer dielectric interference mirror, and the back side of the substrate 12 form a reflecting cavity for enhancing the effective emissivity of the substrate, thereby improving the accuracy of temperature measurement. In certain embodiments, the reflector 28 may have a more irregular surface or have a black or other colored surface to more closely resemble a black-body wall. The reflector 28 may be deposited on a second wall 53, which is a water-cooled base 53 made of metal to heat sink excess radiation from the substrate, especially during cool down. Accordingly, the process area of the processing chamber 10 has at least two substantially parallel walls, of which a first is a window 20, made of a material being transparent to radiation such as quartz, and the second wall 53 which is substantially parallel to the first wall and made of metal significantly not transparent.

One way of improving the uniformity includes supporting the support ring 14 on a rotatable cylinder 30 that is magnetically coupled to a rotatable flange 32 positioned outside the processing chamber 10. A motor (not shown) rotates the flange 32 and hence rotates the substrate about a center 34, which is the centerline of the generally symmetric chamber. Alternatively, the bottom of the rotatable cylinder 30 may be magnetically levitated cylinder held in place by magnets disposed in the rotatable flange 32 and rotated by rotating magnetic field in the rotatable flange 32 from coils in the rotatable flange 32. It is contemplated that the support ring 14 may be support within the processing chamber 10 in another manner; for example, by disposing the support ring 14 on a fixed surface.

Another way of improving the uniformity includes dividing the lamps 26 into zones arranged generally ring-like about the central axis 34. Control circuitry varies the voltage delivered to the lamps 26 in the different zones to thereby tailor the radial distribution of radiant energy. Dynamic control of the zoned heating is affected by, one or a plurality of pyrometers 40 coupled through one or more optical light pipes 42 positioned to face the back side of the substrate 12 through apertures in the reflector 28 to measure the temperature across a radius of the rotating substrate 12. The light pipes 42 may be formed of various structures including sapphire, metal, and silica fiber.

A computerized controller 44 receives the outputs of the pyrometers 40 and accordingly controls the voltages supplied to the different rings of lamps 26 to thereby dynamically control the radiant heating intensity and pattern during the processing. Pyrometers generally measure light intensity in a narrow wavelength bandwidth of, for example, 40 nm in a range between about 700 nm to 1000 nm. The controller 44 or other instrumentation converts the light intensity to a temperature through the well-known Planck distribution of the spectral distribution of light intensity radiating from a black-body held at that temperature. Pyrometry, however, is affected by the emissivity of the portion of the substrate 12 being scanned. Emissivity $\in$ can vary between 1 for a black body to 0 for a perfect reflector and thus is an inverse measure of the reflectivity $R=1-\in$ of the substrate back side. While the back surface of a substrate is typically uniform so that uniform emissivity is expected, the backside composition may vary depending upon prior processing. The pyrometry can be improved by further including an emissometer to optically probe the substrate to measure the emissivity or reflectance of the portion of the substrate it is facing in the relevant wavelength range and the control algorithm within the controller 44 to include the measured emissivity.

Figure 2:
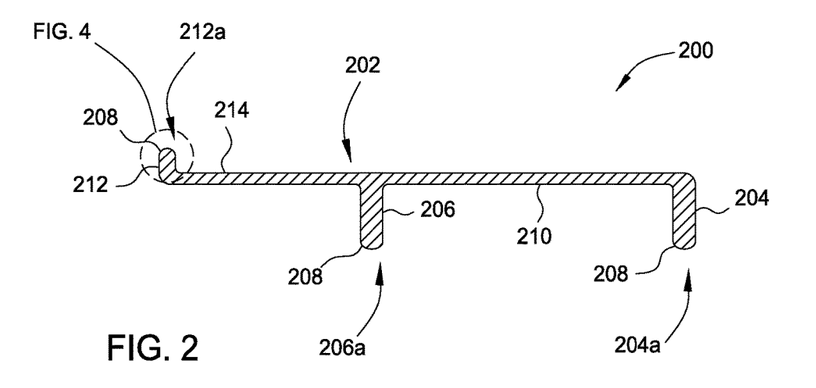
FIG. 2 schematically illustrates a cross-sectional side view of a support ring, according to one embodiment of the invention.

FIG. 2 is a schematic cross-sectional side view of a support ring 200, according to one embodiment of the invention. The support ring 200 illustrated in FIG. 2 may be disposed within a processing chamber, for example the rapid thermal processing chamber 10 shown in FIG. 1, and extend radially inwardly along the inner circumferential surfaces 60 of the processing chamber 10. The support ring may be a continuous ring body (or discrete ring-like bodies or ring sections in certain embodiments) which substantially surrounds a periphery of a substrate.

In the embodiment shown in FIG. 2A, the support ring 200 generally includes a ring body 202 disposed in a plane. An outer rib 204 extends from a first side 210 (e.g., the backside) of the ring body 202. The outer rib 204 is disposed perpendicular to the ring body 202 and is located at the outer perimeter of the ring body 202. The outer rib 204 facilitates support of the support ring 200 within a processing chamber, for example, the processing chamber 10. The support ring 200 also includes a midrib 206 disposed radially inward of the outer rib 204. The midrib 206 extends perpendicularly from the first side of the ring body 202. The midrib 206 increases the rigidity and structural strength of the support ring 200, and, in some embodiments, may facilitate support of the support ring 200 within a processing chamber.

The outer rib 204 and the midrib 206 extend equal distances from the first surface and have generally equal widths. The outer rib 204 and the midrib 206 each include a tip 208 on respective distal ends 204a and 206a thereof, to reduce thermal coupling between the outer rib 204 and the midrib 206, and any surface which may be in contact with the distal ends 204a and 206a. Thus, temperature control of the support ring 200 is more easily accomplished, resulting in higher production quality substrate.

The support ring 200 also includes a substrate support rib 212 extending perpendicularly from a second (e.g., upper) surface 214 of the ring body 202. The second surface 214 is opposite the first surface 210. The substrate support rib 212 is disposed adjacent the radially-inward edge of the ring body 202. A tip 208 of the substrate support rib 212 includes a rounded a distal end 212a. The distal end 212a reduces thermal coupling between the substrate support rib 212 and a substrate positioned thereon by reducing the contacting surface area therebetween. Therefore, the distortion of the thermal gradient around the edge of the substrate is reduced, resulting in an improved temperature profile across the substrate with a minimum edge temperature gradient. Additionally, the distal end 212a facilitates a reduction in particulate contamination.

It is to be noted that the amount of thermal coupling between the substrate support 212 and a substrate positioned thereon can be adjusted by changing the height and width of the substrate support 212, as well as the dimensions of the chamfer on the distal end 212a of the substrate support 212. For example, reducing the height of the substrate support 212 or increasing the width and/or contact area of the support rib 212 generally results in an increase of thermal energy transfer from the support ring 200 to the substrate. In one embodiment, the substrate support rib 212 may have a height of about 0.5 millimeters to about 3 millimeters. Additionally, adjusting the contact location of the substrate support rib 212 relative to the substrate outer perimeter also affects the thermal coupling of the support ring 200 and a substrate. For example, movement of the contact point of the substrate support 212 radially inward on the substrate surface increases heat transfer from the support ring 200 to the substrate.

As illustrated in FIG. 2, the ring body 202 of the support ring 200 is planar. In contrast, prior art support rings include a non-planar support body having a vertical sidewall located in relatively close proximity to an edge of the substrate. The vertical sidewall couples a main portion of the ring body to a lip portion of the ring body. The close proximity of the vertical sidewall to the substrate edge increases the thermal coupling (e.g., radiative coupling) between the substrate and the prior art support ring. The increased radiative coupling of the prior art support rings causes increased temperature gradients across a substrate, for example, a radially-extending temperature gradient. The temperature gradient reduces the quality of processed substrates. However, in contrast, the body 202 of support ring 200 described herein lacks the aforementioned lip and vertical component, and additionally includes a chamfered or rounded substrate support rib 212 that reduces radiative coupling between the support ring 200 and a substrate disposed thereon. Thus, the support ring 200 facilitates improved substrate temperature control and promotes more uniform substrate temperature profiles.

The support ring 200 may be made of a material that is transparent to radiation in the frequency range used for temperature measurements of the substrate. In one example, the support ring 200 is made of silicon carbide. Other materials, such as silicon carbide alloys, ceramics, or high temperature materials such as amorphous silica, $Al_2O_3$, $ZrO_2$, $Si_3N_4$, or similar material, are also contemplated. The support ring 200 may be optionally coated with silicon dioxide ($SiO_2$) or any other suitable material to prevent Si—Si bonding with the back surface of a substrate. The support ring 200 may alternatively be made of a material similar to the substrate so as to minimize absorptivity/reflectance mismatch between the substrate and the support ring 200. In certain embodiments, the support ring 200 may be optionally coated with a layer of polycrystalline silicon (polysilicon) to render it opaque to radiation in a frequency range used for a temperature measurement of a substrate in a thermal processing chamber.

FIG. 2 illustrates one embodiment; however, additional embodiments are also contemplated. In another embodiment, it is contemplated that the outer rib 204 and the midrib 206 may have unequal lengths and/or widths.

Figure 3A:
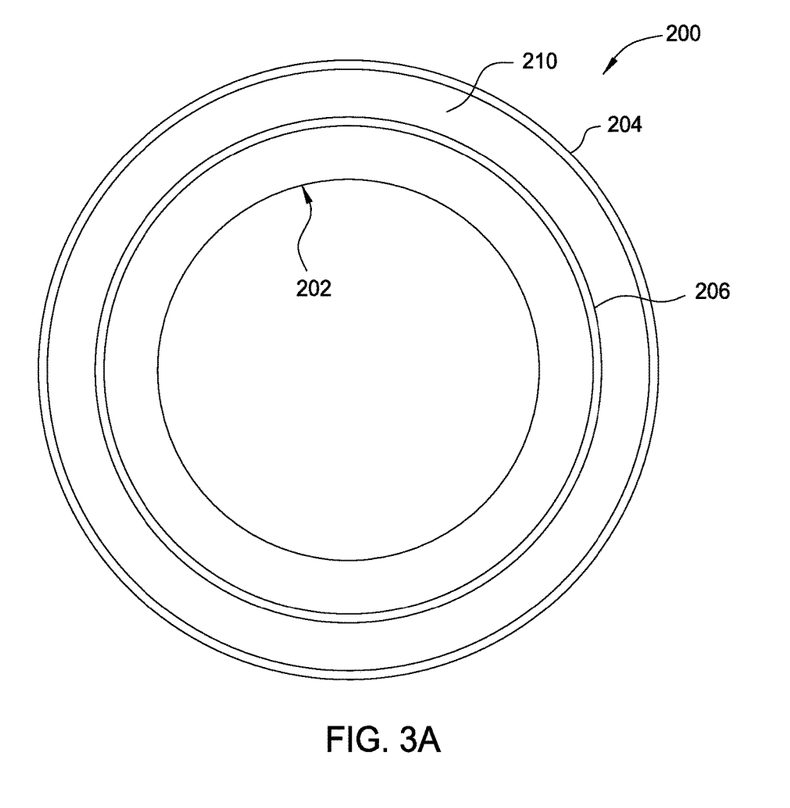
FIG. 3A schematically illustrates a bottom view of the support ring of FIG. 2.
Figure 3B:
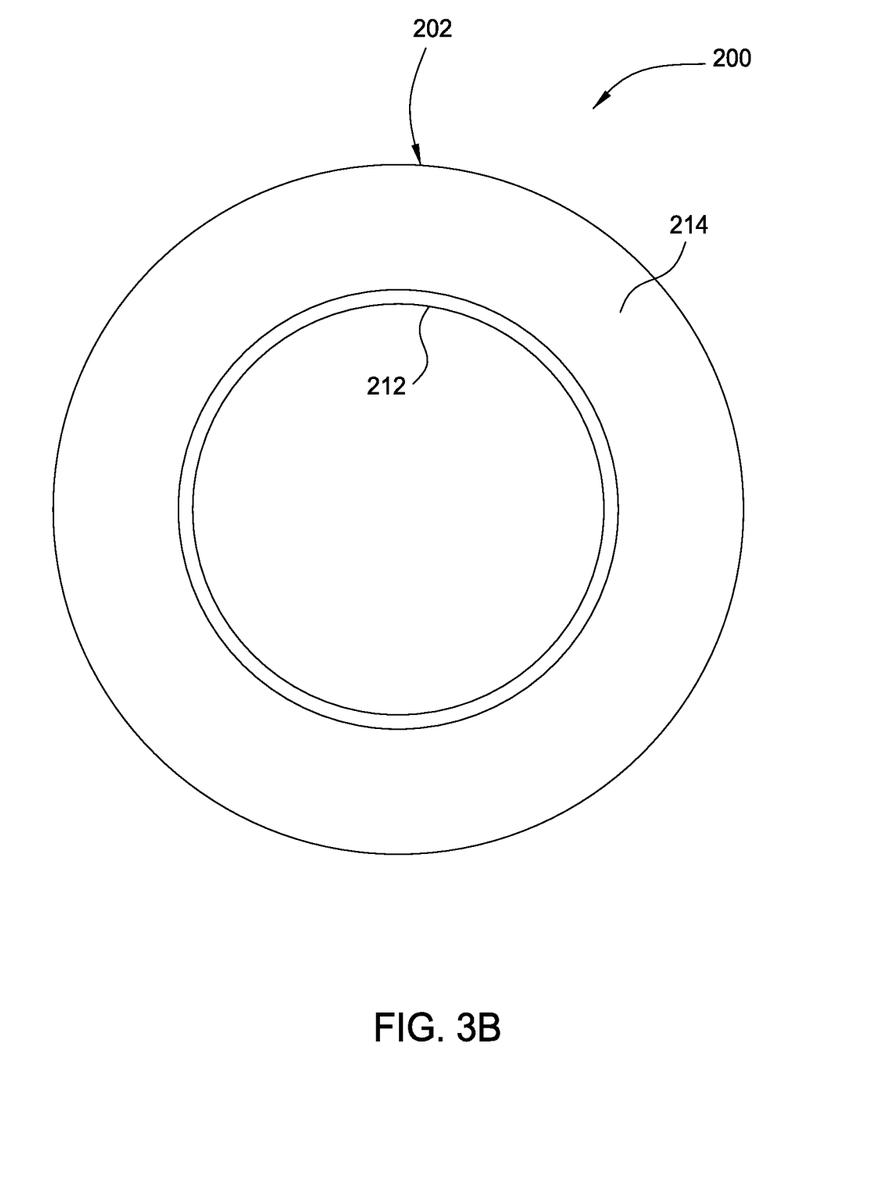
FIG. 3B schematically illustrates a top view of the support ring of FIG. 2.

FIG. 3A schematically illustrates a bottom view of the support ring 200 of FIG. 2. FIG. 3A illustrates the outer rib 204 concentrically disposed about the midrib 206 on the first side 210 of the ring body 202 of the support ring 200. It is contemplated that radial position of the midrib 206 relative to the outer rib 204 may be adjusted to provide adequate structure strength to the support ring 200, or to facilitate placement of the support 200 within a processing chamber. FIG. 3B schematically illustrates a top view of the support ring 200 of FIG. 2. FIG. 3B illustrates the substrates support rib 212 disposed on the second surface 214 adjacent to the inner radial edge of the ring body 202 of the support ring 200.

Figure 4:
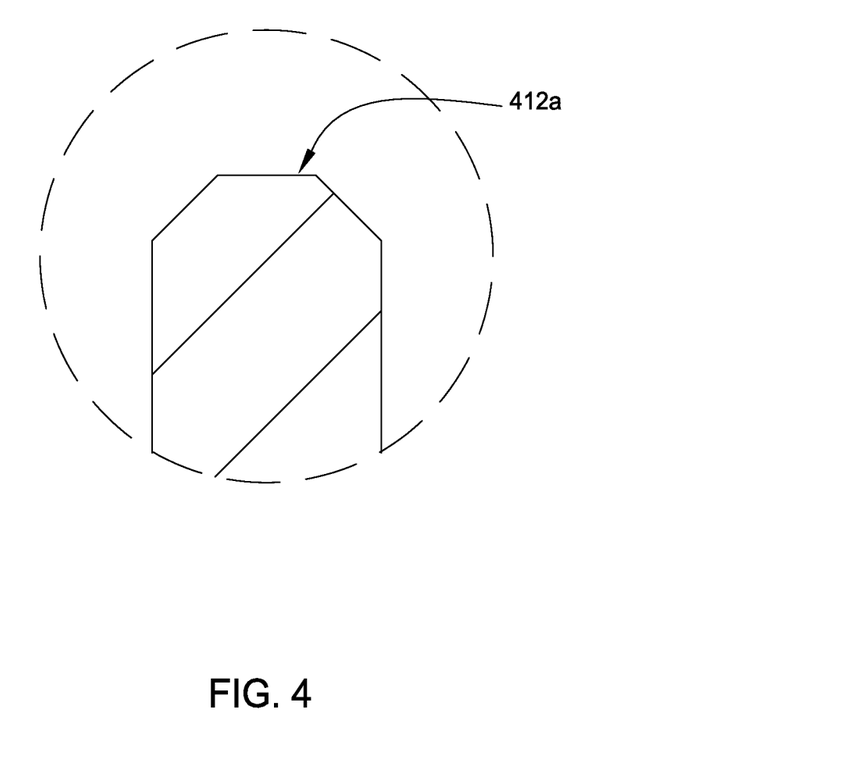
FIG. 4 illustrates an alternative view of a distal end of a substrate support rib, according to another embodiment of the invention.

FIG. 4 illustrates an alternative view of a distal end 412a of a substrate support rib 212, according to another embodiment of the invention. As illustrated, the distal end 412*a* includes a beveled or chamfered shape. Other shapes which reduce the surface area of the tip 208 of the substrate support rib 212 in contact with the substrate are also contemplated.

Benefits of the invention include reduced thermal coupling between support rings and substrates positioned thereon. The reduced thermal coupling reduces the temperature gradient across substrates during processing, thereby improving manufacturing quality and facilitating easier substrate temperature control. Moreover, the reduction in physical contact between support rings described herein and substrates supported thereon reduces process temperature variations caused by changes in process pressures.

While the foregoing is directed to embodiments of the present invention, other and further embodiments of the invention may be devised without departing from the basic scope thereof, and the scope thereof is determined by the claims that follow.

The invention claimed is:

1. A support ring for supporting a substrate during thermal processing, the support ring comprising:
    a ring body disposed in a plane, the ring body having:
        a first end at a radially-outward edge;
        a second end at a radially-inward edge;
        a first surface on a backside of the ring body; and
        a second surface opposite the first surface, the second surface extending between the first end and the second end of the ring body;
    an outer rib extending from the first surface of the ring body at the first end, the outer rib facilitating support of the support ring within a processing chamber;
    a midrib extending from the first surface of the ring body between the first end and the second end of the ring body; and
    a substrate support rib extending from the second surface of the ring body at the second end of the ring body, wherein the substrate support rib includes a rounded end.

2. The support ring of claim 1, wherein the outer rib and the midrib are perpendicular to the ring body.

3. The support ring of claim 1, wherein the support ring comprises silicon carbide.

4. The support ring of claim 1, wherein the substrate support rib has a height of about 0.5 millimeters to about 3 millimeters.

5. The support ring of claim 1, wherein the support ring comprises one or more of $Al_2O_3$, $ZrO_2$, and $Si_3N_4$.

6. The support ring of claim 1, further comprising silicon dioxide coating thereon.

7. The support ring of claim 1, further comprising a polysilicon coating thereon.

8. A support ring for supporting a substrate during thermal processing, the support ring comprising:
    a ring body disposed in a plane, the ring body having:
        a first end at a radially-outward edge;
        a second end at a radially-inward edge;
        a first surface on a backside of the ring body; and
        a second surface opposite the first surface, the second surface extending between the first end and the second end of the ring body;
    an outer rib extending from the first surface of the ring body at the first end, the outer rib facilitating support of the support ring within a processing chamber;
    a midrib extending from the first surface of the ring body between the first end of the ring body and the second end of the ring body, wherein the outer rib and the midrib each comprise a rounded end; and
    a substrate support rib extending from the second surface of the ring body at the second end of the ring body.

9. The support ring of claim 8, wherein the substrate support rib includes a beveled end.

10. The support ring of claim 9, wherein the outer rib is positioned concentrically to the midrib.

11. The support ring of claim 10, wherein the outer rib and the midrib are perpendicular to the ring body.

12. The support ring of claim 11, wherein the support ring comprises silicon carbide.

13. A support ring for supporting a substrate during thermal processing, the support ring comprising:
    a ring body disposed in a plane, the ring body having:
        a first end at a radially-outward edge;
        a second end at a radially-inward edge;
        a first surface on a backside of the ring body; and
        a second surface opposite the first surface, the second surface extending between the first end and the second end of the ring body;
    an outer rib extending from the first surface of the ring body at the first end, the outer rib facilitating support of the support ring within a processing chamber;
    a midrib extending from the first surface of the ring body between the first end and the second end of the ring body, wherein the outer rib is positioned concentrically to the midrib, and wherein the outer rib and the midrib are substantially equal in height; and
    a substrate support rib extending from the second surface of the ring body at the second end of the ring body.

14. A support ring for supporting a substrate during thermal processing, the support ring comprising:
    a ring body disposed in a plane, the ring body having:
        a first end at a radially-outward edge;
        a second end at a radially-inward edge;
        a first surface on a backside of the ring body; and
        a second surface opposite the first surface, the second surface extending between the first end and the second end of the ring body;
    an outer rib extending from the first surface of the ring body at the first end, the outer rib facilitating support of the support ring within a processing chamber;
    a midrib extending from the first surface of the ring body between the first end and the second end of the ring body, wherein the outer rib and the midrib each comprise a beveled end; and
    a substrate support rib extending from the second surface of the ring body at the second end of the ring body.

15. A support ring for supporting a substrate during thermal processing, the support ring comprising:
    a ring body disposed in a plane, the ring body having:
        a first end at a radially-outward edge;
        a second end at a radially-inward edge;
        a first surface on a backside of the planar ring body; and
        a second surface opposite the first surface, the second surface extending between the first end and the second end of the planar ring body;
    an outer rib extending perpendicularly from the first surface of the planar ring body at the first end, the outer rib facilitating support of the support ring within a processing chamber;
    a midrib extending perpendicularly from the first surface of the planar ring body, the midrib positioned concentrically to the outer rib; and
    a substrate support rib extending perpendicularly from the second surface of the planar ring body at the second end, the substrate support rib including a rounded distal end.

16. The support ring of claim 15, wherein the support ring comprises one or more of $Al_2O_3$, $ZrO_2$, and $Si_3N_4$.

17. The support ring of claim 15, wherein the support ring comprises silicon carbide.

18. The support ring of claim 15, further comprising silicon dioxide coating thereon.

* * * * *